(12) United States Patent
Elizondo-Decanini

(10) Patent No.: US 10,317,300 B1
(45) Date of Patent: Jun. 11, 2019

(54) FREQUENCY SHIFTED, VACUUM PRESSURE SENSOR

(71) Applicant: Sandia Corporation, Albuquerque, NM (US)

(72) Inventor: Juan M. Elizondo-Decanini, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 353 days.

(21) Appl. No.: 15/281,909

(22) Filed: Sep. 30, 2016

(51) Int. Cl.
*G01L 9/12* (2006.01)
*G01L 9/00* (2006.01)
*H01L 29/93* (2006.01)

(52) U.S. Cl.
CPC ............. *G01L 9/0098* (2013.01); *G01L 9/12* (2013.01); *H01L 29/93* (2013.01)

(58) Field of Classification Search
CPC ...................................................... G01L 9/12
See application file for complete search history.

(56) References Cited

U.S. PATENT DOCUMENTS 9,472,689 B1 * 10/2016 Elizondo-Decanini ...................... H01L 29/93

OTHER PUBLICATIONS

Unpublished U.S. Appl. No. 14/843,060, filed Sep. 2, 2015 (Juan M. Elizondo-Decanini).

* cited by examiner

*Primary Examiner* — Jamel E Williams
(74) *Attorney, Agent, or Firm* — Stearne Kessler; Samantha Updegraff

(57) ABSTRACT

Described herein is an apparatus that includes a varactor and an inductor to form a resonant circuit that oscillates at a resonant frequency. The resonant frequency is a function of a pressure of a gas within an aperture of the varactor. In some embodiment, the varactor includes a first layer of p-type material, a first layer of n-type material, and a first np junction formed between the layer of p-type material and the layer of n-type material. The aperture extends at least partially through the layer of p-type material, at least partially through the layer of n-type material, and entirely through the np junction.

13 Claims, 5 Drawing Sheets

US 10,317,300 B1

FREQUENCY SHIFTED, VACUUM PRESSURE SENSOR

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

A varactor is a type of diode that behaves as a variable capacitor. With more particularity, a varactor includes an np semiconductor junction, wherein capacitance of the junction is a function of voltage applied across the junction.

SUMMARY

A first pressure sensing device is disclosed which includes a varactor and an inductor. The varactor includes an aperture having a gas disposed therein. The inductor and the varactor form a resonant circuit that resonates at a resonant frequency. The resonant frequency is a function of a pressure of the gas.

A second pressure sensing device is disclosed which includes a varactor and an inductor. The varactor includes an aperture. The varactor causes a photon, and charge particle, producing micro-discharge within the aperture to influence and determine a capacitance of the varactor. The resonant circuit resonates at a resonant frequency that is a function of the determined capacitance and an inductance of the inductor.

A method for operating a pressure sensing device. The method includes: coupling a varactor of the pressure sensing circuit to an inductor to form a resonant circuit, ionizing a gas within an aperture of the varactor to form a plasma within the aperture, using the plasma to cause a micro-discharge within the aperture, wherein a number of photons, and ionized particles including free electrons, in the micro-discharge impacting the aperture is related to a capacitance of a varactor of the pressure sensing device, and measuring a resonant frequency of the pressure sensing device.

DETAILED DESCRIPTION

Figure 1:
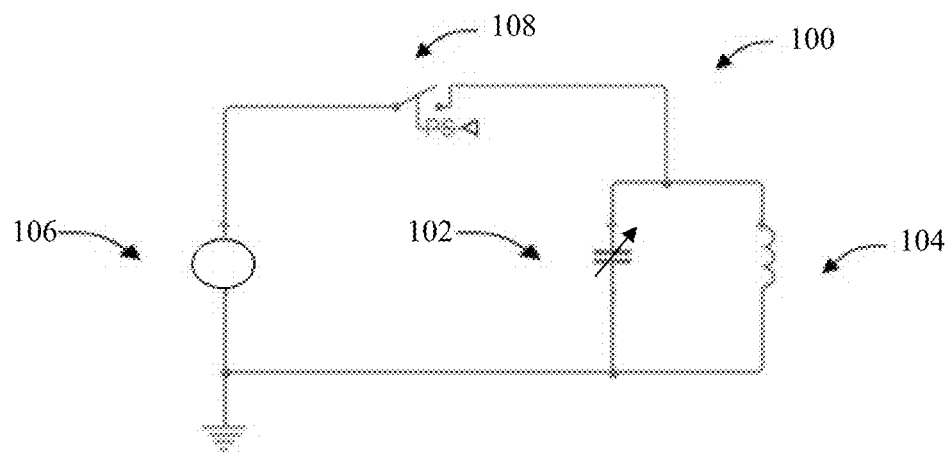
FIG. 1 illustrates a pressure sensing circuit 100.

Pressure Sensing Circuit
FIG. 1 illustrates a pressure sensing circuit 100. Pressure sensing circuit 100 includes a varactor 102, an inductor 104, a voltage source 106, and a switch 108.

Varactor 102 and inductor 104 from a resonant circuit that resonates at a resonant frequency. The resonant frequency is a function of a capacitance of varactor 102 and an inductance of inductor 104. The capacitance of varactor 102 is a function of a pressure of a gas within one or more apertures of varactor 102.

Pressure sensing circuit 100 can be coupled to an external, or integrated, circuitry to measure the resonant frequency. The pressure of the gas within the one or more apertures can be determined from the measured resonant frequency.

In an exemplary embodiment, pressure sensing circuit 100 can be included within a hermetically sealed package. Pressure sensing circuit 100 can detect for difference in pressure of a gas within the hermetically sealed package upon opening of the hermetically sealed package.

Figure 2:
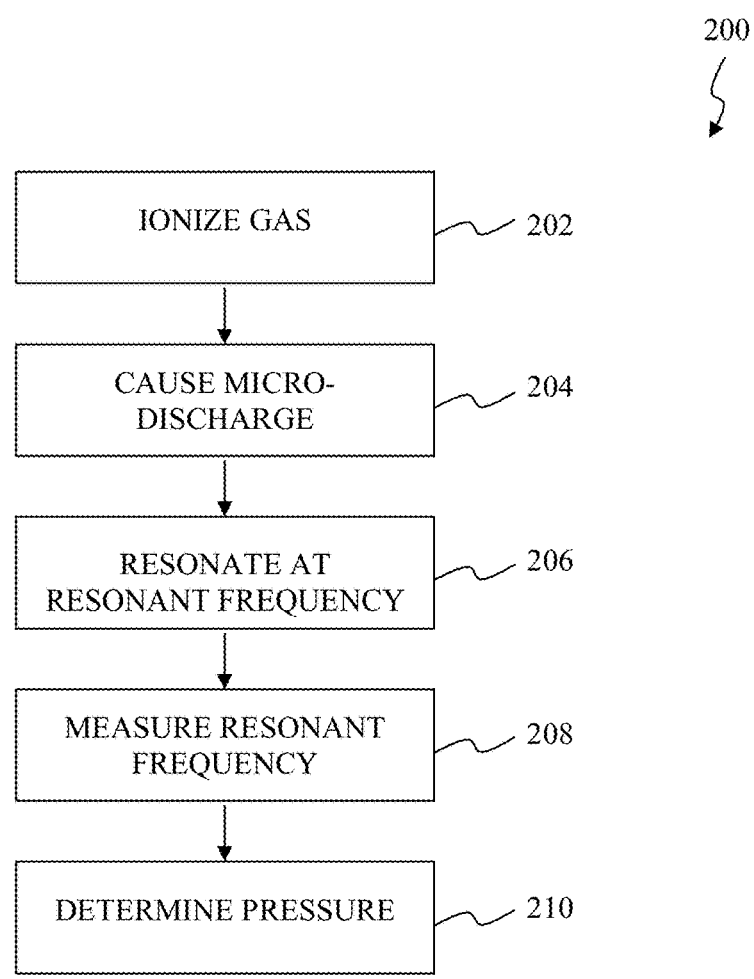
FIG. 2 is a flowchart for operating the pressure sensing circuit 100.

Method of Operation of the Pressure Sensing Circuit
FIG. 2 is a flowchart illustrating operation of pressure sensing circuit 100 via operational control flow 200.

At step 202, switch 108 is operated to apply an input voltage signal across varactor 102 and inductor 104. The voltage ionizes a gas within one or more apertures of varactor 102 to form a plasma within the one or more apertures. The input voltage signal can be a single pulse, a repetitive series of pulses, or a constant applied voltage.

At step 204, plasma in the one or more apertures causes a micro-discharge (of light, charge particles, and/or space charge) to occur. Some photons, and charge particles, in the micro-discharge exit the one or more apertures of varactor 102, and some photons, and charge particles, in the micro-discharge impact exposed portion(s) of one or more np junctions within the one or more apertures of varactor 102. A capacitance of varactor 102 varies as a function of the number of photons, and charge particles, in the micro-discharge impacting the exposed portion(s) of the one or more np junctions. This number of photons, and charge particles, is affected in turn by the gas pressure in the aperture.

At step 206, the pressure sensing circuit 100 resonates at the resonant frequency. The resonant frequency is dependent upon the capacitance of varactor 102 and the inductance of inductor 104. Because the capacitance of varactor 102 is a function of a pressure of a gas within the one or more apertures of varactor 102, the resonant frequency is in turn a function of gas pressure.

At step 208, the resonant frequency of the pressure sensing circuit 100 is measured. This measurement may be performed by coupling the pressure sensing circuit 1100 to a radiating dipole, a coupling inductor, by measuring characteristics of the micro-discharge, or by other suitable circuitry means.

At step 210, the pressure of the gas within the one or more apertures is determined from the measurements taken in step 208. For example, the resonant frequency can be compared with a look-up table that correlates frequency to the pressure of the gas in the one or more apertures of varactor 102. This look-up table can be calibrated in advance, and stored in a programmable memory (PROM/EPROM) chip to determine the absolute pressure of the gas in the one or more apertures of varactor 102. Other suitable means may be used to correlate the measurement of step 208 to gas pressure.

Figure 3:
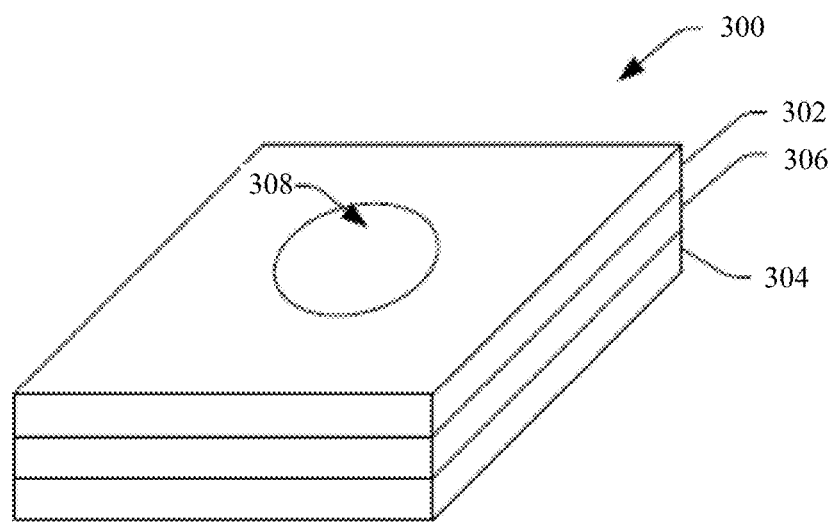
FIG. 3 illustrates a varactor 300.

Varactor
FIG. 3 illustrates a varactor 300. Varactor 300 includes a layer of n-type material 302, a layer of p-type material 304, an np junction 306, and aperture 308. Varactor 300 can be used as varactor 102 as shown in FIG. 1.

The layer of n-type material 302, the layer of p-type material 304, and the np junction 306 can be formed of any suitable semiconductor material(s), such as an ultra-wide bandgap (UWBG) semiconductor material. Exemplary semiconductor materials that can be used to form the layers of the varactor 300 include, but are not limited to, metal-oxides, Si, GaAs, SiO, SiC, AlN, and GaN. Any suitable doping may be used.

Np junction 306, also referred to as a pn junction, represents transition region between layer of n-type material 302 and layer of p-type material 304. While illustrated as having significant thickness, np junction 306 may be an interface between layer of n-type material 302 and layer of p-type material 304.

Aperture 308 extends at least partially through layer of n-type material 302, at least partially through layer of p-type material 304, and entirely through np junction 306. Aperture 308 may be cylindrical in nature, cubic in nature, conical in nature, or any other suitable shape.

A gas is disposed in the aperture 308. The gas can be any suitable gas, such as air, nitrogen, argon, or the like. A capacitance of varactor 300 is a function of a pressure of the gas.

Pressure Sensing Circuit Having a Varactor

Figure 4:
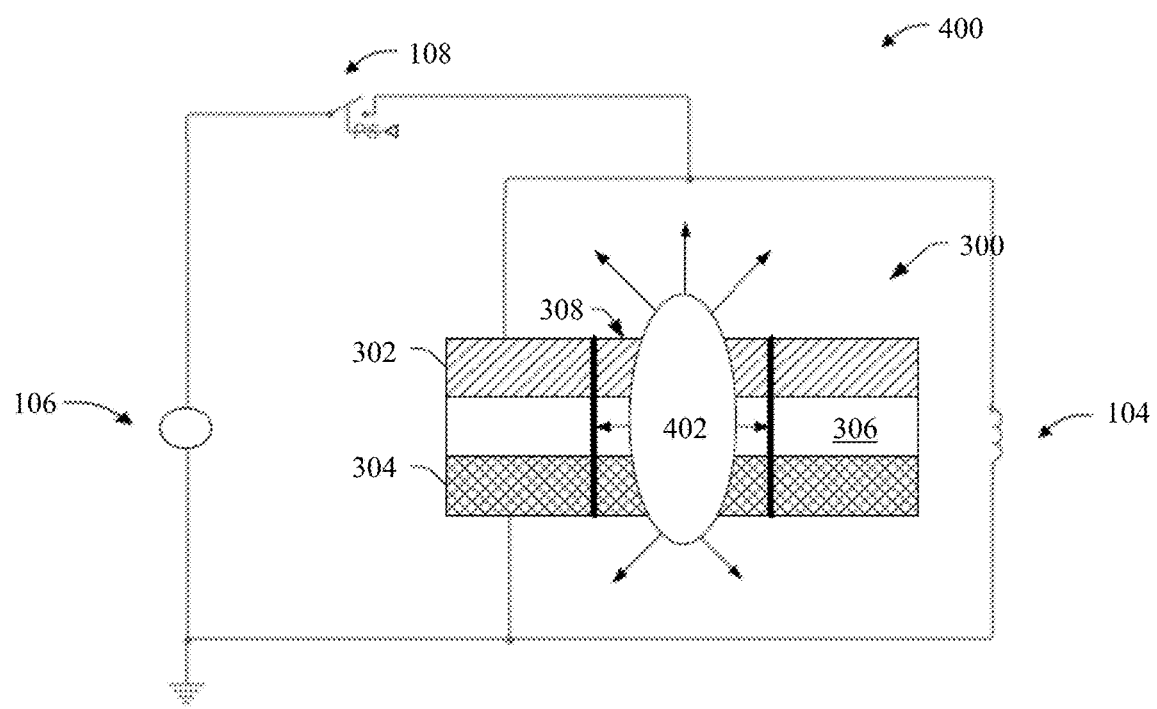
FIG. 4 illustrates a pressure sensing circuit 400.

FIG. 4 illustrates a pressure sensing circuit 400. Pressure sensing circuit 300 includes inductor 104, voltage source 106, switch 108, and varactor 300. Varactor 300 of FIG. 4 is illustrated as a cross-sectional view of varactor 300 of FIG. 3. The parts of varactor 300 are described in detail with respect to FIG. 3. Plasma 402 is shown in aperture 308.

During operation, voltage source 106 applies a voltage from voltage source 106 across np junction 306 (e.g., with a controlled frequency and amplitude) when switch 108 is closed. Voltage source 106 is electrically coupled to layer of n-type material 302 and layer of p-type material 304. Voltage source 106 supplies a sufficiently high voltage to ionize gas disposed in the aperture 308 of varactor 300 to form plasma 402.

Plasma 402 in aperture 308 causes a micro-discharge of photons (light), charged particles, and consequently space charge effects. The photons are emitted isotropically in the aperture 308 of varactor 300, as indicated by the arrows in FIG. 4. Some photons, and charge particles, in the micro-discharge exit the aperture 308, and some photons, and charge particles in the micro-discharge will impact the exposed portion of np junction 306 in the aperture 308.

The photons, charge particles, and space charge impacting the exposed portion of the np junction 306 in the aperture 308 cause the capacitance of the np junction 306 to alter. Photons, charge particles, and space charge impinging upon the surface of the np junction 306 in the aperture induce photo-carriers in the np junction 306, which change the carrier distribution in the np junction 306; therefore, the capacitance of the np junction is changed. Additionally, the amplitude and frequency of the voltage applied across the np junction 306 by the voltage source 106 also cause the capacitance of the np junction 306 to alter.

The frequency of light emitted during a micro-discharge is affected by the gas disposed in aperture 308 of varactor 300, as well as the bandgap of the semiconductor material. So, to improve pressure sensing efficiency and accuracy, the frequency of light may be selected by selecting the gas and the semiconductor bandgap. A specific gas pressure sensor application may use a different semiconductor material, and a tailored np-junction doping distribution, thus enhancing sensor accuracy and efficiency.

The intensity of the micro-discharge can be controlled by an amplitude and frequency of the voltage applied across the np junction 306 by the voltage source 106. This utilization of two control parameters to set the capacitance of the np junction 306 of varactor 300 can allow for a desired capacitance to be reached more quickly, and efficiently, when compared to conventional varactors.

In this embodiment, a continuous oscillatory signal from voltage source 106, at a voltage not sufficient to produce the microdischarge by itself, registers a frequency shift when an external source, of light or charge particles, is applied or travels thru, aperture 308. In such embodiment beams of charge particles such as ion and electron beams, can be measured given that its presence is equivalent to a local change in pressure.

Graph of Operation

Figure 5:
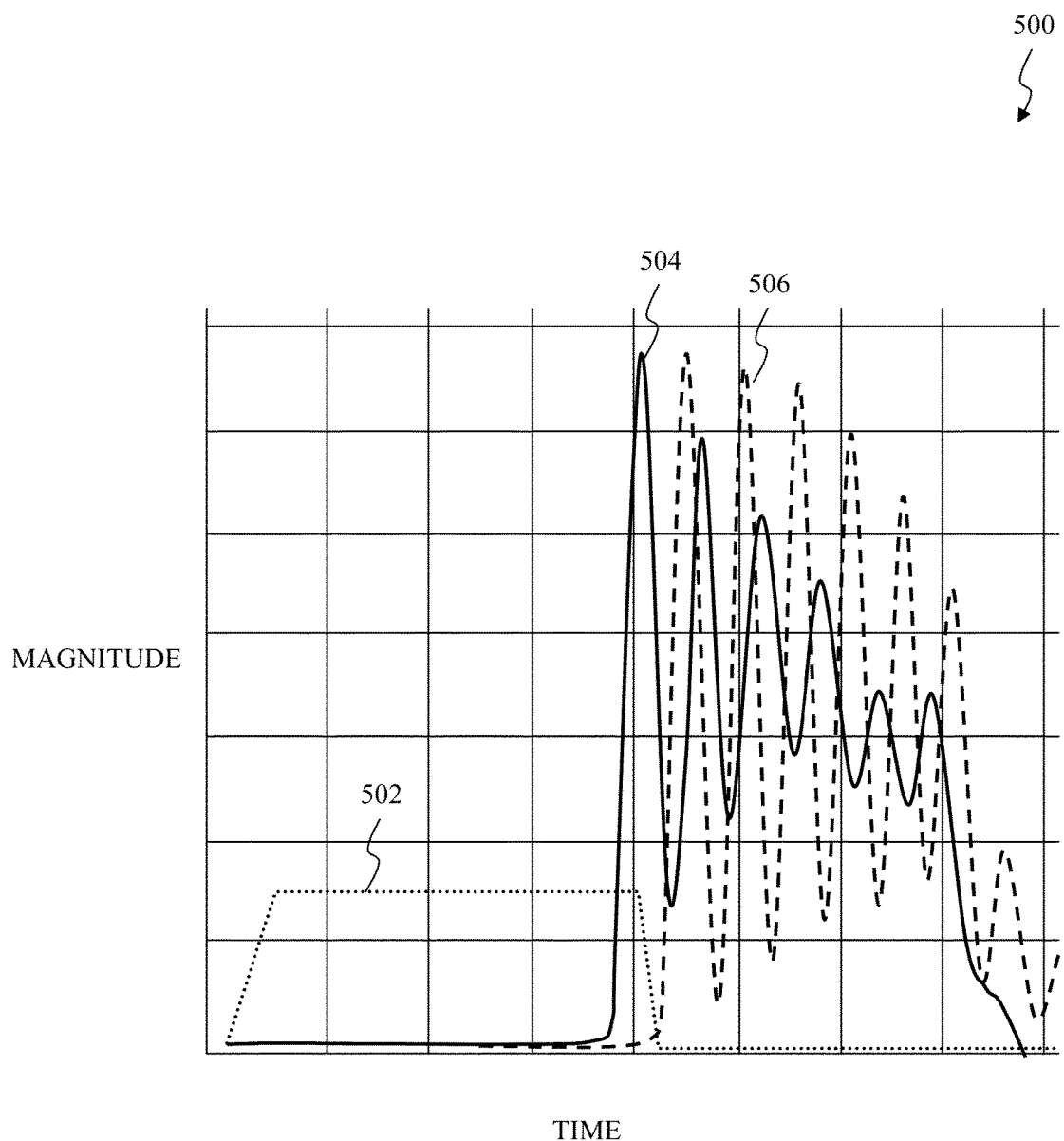
FIG. 5 illustrates a graph 500 of operation of pressure sensing circuit 400.

FIG. 5 illustrates a graph 500 of operation of pressure sensing circuit 400. Graph 500 displays time versus magnitude for different pressures. When input signal 502 is applied to pressure sensing circuit 400, pressure sensing circuit 400 produces a first signal 504 when the gas disposed in aperture 308 is at a first pressure or a second signal 506 when the gas disposed in aperture 308 is at a second pressure greater than the first pressure. First signal 504 and second signal 506 can be measured by coupling sensing circuit 400 to a radiating dipole, a coupling inductor, or other suitable means. The resonant frequency of pressure sensing circuit 400 can be determined from this measurement.

Varactor with Multiple Apertures

Figure 6:
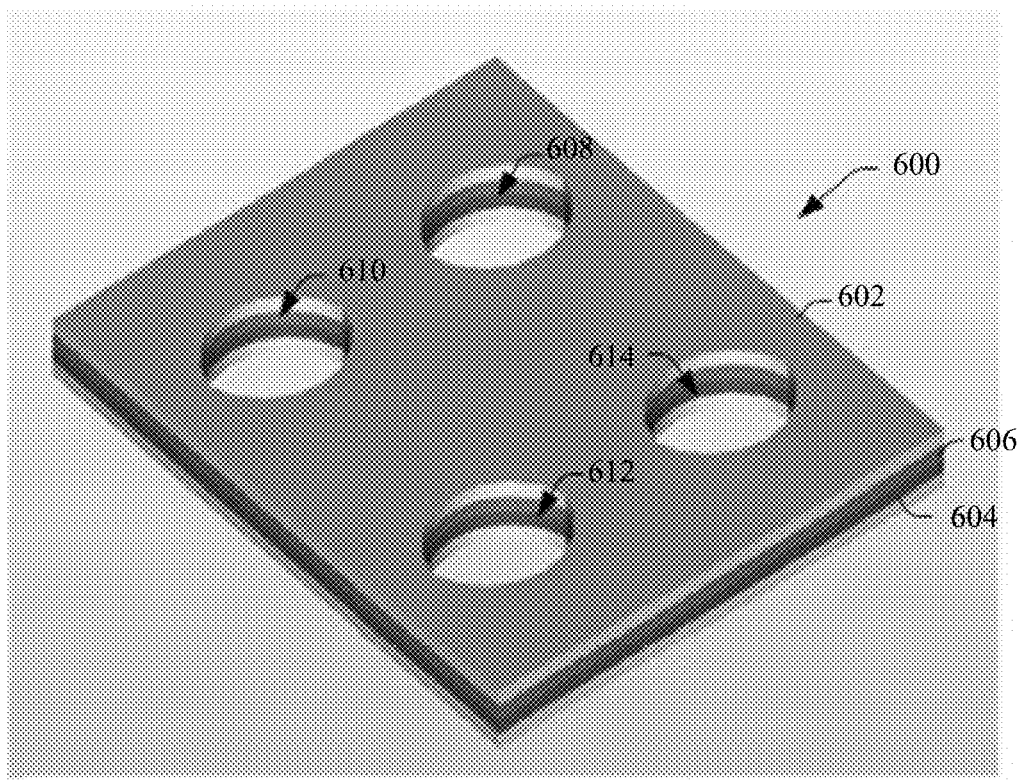
FIG. 6 illustrates a varactor 600.

FIG. 6 illustrates a varactor 600. Varactor 600 includes a layer of n-type material 602, a layer of p-type material 604, an np junction 606, and apertures 608 through 614.

The materials, structure and operation of varactor 600, layer of n-type material 602, a layer of p-type material 604, an np junction 606, are similar to the corresponding parts of FIG. 3, varactor 300, layer of n-type material 302, a layer of p-type material 304, an np junction 306, respectively.

Varactor 600 differs from varactor 300 in that varactor 600 has multiple apertures. Apertures 608 through 614 extend at least partially through layer of n-type material 602, at least partially through layer of p-type material 604, and entirely through np junction 606. Aperture 608 through 614 may be cylindrical in nature, cubic in nature, conical in nature, or any other suitable shape.

A gas is disposed in apertures 608 through 614. The gas can be any suitable gas, such as nitrogen, air, argon, or the like. A capacitance of varactor 600 is a function of a pressure of the gas disposed in apertures 608 through 614. Inclusion of multiple apertures in the varactor 600 allows for (simultaneous) formation of micro-discharges in apertures 608 through 614, thereby enhancing the effect of capacitance change caused by photons, and charge particles, impinging upon exposed portions of the np junction in the apertures 608 through 514.

Varactor 600 can be used as a part of a gas pressure sensor, for example in a manner similar to varactor 102 as shown in FIG. 1.

Figure 7:
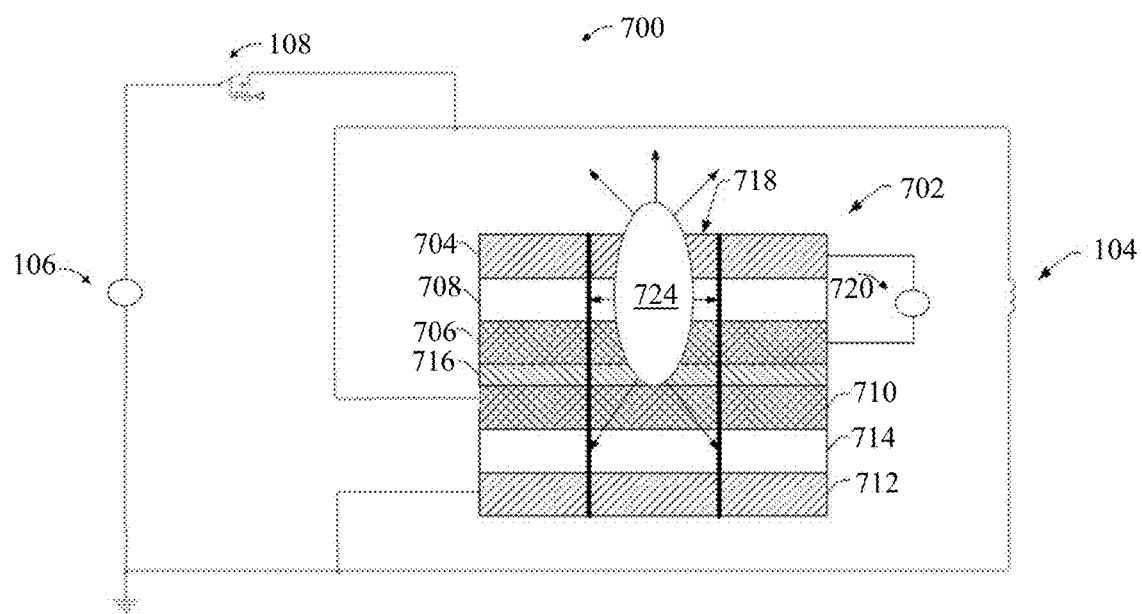
FIG. 7 illustrates a pressure sensing circuit 700.
Features are not necessarily drawn to scale.

Pressure Sensing Circuit Having Varactor with Multiple Layers of p- and n-Type Material FIG. 7 illustrates a pressure sensing circuit 700. Pressure sensing circuit 700 includes inductor 104, voltage source 106, switch 108, and varactor 702. Varactor 702 includes a first layer of p-type material 704, a first layer of n-type material 706, and a first np junction 708 formed between first layer of p-type material 704 and first layer of n-type material 706. Varactor 702 includes a second layer of n-type material 710, a second layer of p-type material 712, and a second np junction 714 formed between the second layer of n-type material 710 and the second layer of p-type material 712. Varactor 702 may also optionally include a layer of dielectric material 716 disposed between the layer of n-type material 706 and the second layer of n-type material 710.

Aperture 718 extends through first layer of p-type material 704, first np junction 708, first layer of n-type material 706, layer of dielectric material 716 (if present), second layer of n-type material 710, second np junction 714, and second layer of p-type material 712.

While the layers of varactor 702 are shown and described in a certain order (e.g. p-n-n-p), other orders are contemplated. For instance, the layers shown as being p-type material in FIG. 7 may instead be formed of n-type material, and layers of p-type material in FIG. 7 may instead be layers of n-type material. In any event, varactor 702 at least two np junctions stacked on top of one another, and aperture 718 extends through both np junctions. This order may be dictated by the polarity and characteristics of the voltage source 106, such as being DC, pulsed, or high frequency, and the resulting resonant frequency measuring circuitry.

A voltage source 720 is electrically coupled to layer of p-type material 704 and layer of n-type material 706, such that voltage source 720 is configured to apply a first voltage across np junction 708.

Voltage source 106 is electrically coupled to second layer of n-type material 710 and second layer of p-type material 712, such that voltage source 106 is configured to apply a second voltage across second np junction 714. Accordingly, the voltages (e.g., voltage amplitudes and frequencies) across np junctions 708 and 714 can be controlled independently.

In the example shown in FIG. 7, voltage source 720 is configured to apply a first voltage across np junction 708, such that a plasma 724 is formed in aperture 718, resulting in a micro-discharge. Voltage source 720 can be controlled to output a voltage of particular amplitude and frequency, thereby generating micro-discharges of desired amplitude at desired frequencies, which in turn affect capacitance of second np junction 714.

As shown by the arrows, at least some photons, and charge particles, emitted during the micro-discharge impinge upon a surface of second np junction 714 exposed in aperture 718, thereby affecting the capacitance of second np junction 714. Voltage source 106 is configured to apply a second voltage (e.g., with a desired amplitude and frequency) across second np junction 714, thereby further affecting the capacitance of second np junction 714. In other words, the light, and charge particles density, in the micro-discharge can be controlled independently from the voltage used to alter the capacitance of second np junction 714.

The capacitance of second np junction 714 and an inductance of inductor 104 form a resonant circuit. The capacitance of second np junction 714 is a function of a pressure of a gas within the aperture 718. A resonant frequency of the resonant circuit can be measured and the pressure of the gas within aperture 718 can be determined from the measured resonant frequency.

CONCLUSION

The Detailed Description referred to accompanying figures to illustrate exemplary embodiments consistent with the disclosure. References in the disclosure to "an exemplary embodiment" indicates that the exemplary embodiment described include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A pressure sensing device, comprising:
   a varactor including an aperture having a gas disposed therein;
   an inductor, coupled to the varactor to form a resonant circuit, configured to resonate at a resonant frequency, the resonant frequency being a function of a pressure of the gas; and
   a switch configured to pass a voltage to the resonant circuit when closed and not pass the voltage to the resonant circuit when opened.

2. The device of claim 1, wherein the varactor comprises:
   a first layer of p-type material;
   a first layer of n-type material; and
   a first np junction formed between the layer of p-type material and the layer of n-type material,
   wherein the aperture extends at least partially through the layer of p-type material, at least partially through the layer of n-type material, and entirely through the np junction.

3. The pressure sensing device of claim 1, wherein the aperture is from among a plurality of apertures, each of the plurality of apertures having the gas disposed therein.

4. The pressure sensing device of claim 1, wherein the gas comprises: air, or argon.

5. The pressure sensing device of claim 2, wherein the varactor is configured to have a capacitance that varies as a function of a number of a photons, and charge particles, impacting the np junction.

6. The pressure sensing device of claim 2, wherein the varactor further comprises:
   a second layer of p-type material;
   a second layer of n-type material; and
   a second np junction formed between the second layer of p-type material and the second layer of n-type material;

wherein the aperture extends at least partially through the second layer of p-type material, at least partially through the second layer of n-type material, and entirely through the second np junction.

7. The pressure sensing device of claim 6, further comprising:
a voltage source configured to provide a voltage across the first np junction,
wherein the inductor is coupled to the second layer of p-type material and the second layer of n-type material.

8. The pressure sensing device of claim 1, wherein a largest dimension of the pressure sensing device is not more than 20 mm.

9. The pressure sensing device of claim 1, wherein the pressure sensing device is configured to produce a micro-discharge of light, and charge particles, at an intensity that depends on the pressure of the gas.

10. The pressure sensing device of claim 9, further comprising a sensor configured to detect the resonant frequency.

11. A method for operating a pressure sensing device, the method comprising:
coupling a varactor of the pressure sensing circuit to an inductor to form a resonant circuit;
ionizing a gas within an aperture of the varactor by applying a pulse or a repetitive series of pulses to the varactor to form a plasma within the aperture;
using the plasma to cause a micro-discharge within the aperture, wherein a number of photons in the micro-discharge impacting the aperture is related to a capacitance of a varactor of the pressure sensing device; and
measuring a resonant frequency of the pressure sensing device.

12. The method of claim 11, further comprising:
determine the pressure of a gas in the one or more apertures based on the measured resonant frequency.

13. The pressure sensing device of claim 1, wherein the inductor is coupled to the varactor in parallel to form a parallel resonant circuit.

* * * * *